(12) United States Patent
Komura

(10) Patent No.: US 6,845,051 B2
(45) Date of Patent: Jan. 18, 2005

(54) SEMICONDUCTOR MEMORY DEVICE AND DATA ACCESS METHOD FOR SEMICONDUCTOR MEMORY DEVICE

(75) Inventor: Kazufumi Komura, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 123 days.

(21) Appl. No.: 10/261,418

(22) Filed: Oct. 2, 2002

(65) Prior Publication Data

US 2003/0107932 A1 Jun. 12, 2003

(30) Foreign Application Priority Data

Dec. 6, 2001 (JP) ........................................ 2001-372384

(51) Int. Cl.[7] .................................................. G11C 7/00
(52) U.S. Cl. .................... 365/203; 365/205; 365/230.03
(58) Field of Search ................................ 365/203, 205, 365/230.03

(56) References Cited

U.S. PATENT DOCUMENTS 5,872,737 A * 2/1999 Tsuruda et al. ........ 365/189.05
6,347,058 B1 * 2/2002 Houghton et al. .......... 365/203
6,519,198 B2 * 2/2003 Suematsu et al. .......... 365/205

FOREIGN PATENT DOCUMENTS

JP 8-241968 9/1996
JP 8-249885 9/1996
JP 8-315576 11/1996

* cited by examiner

*Primary Examiner*—Hoai Ho
(74) *Attorney, Agent, or Firm*—Arent Fox PLLC

(57) ABSTRACT

There are provided a semiconductor memory device and a data access method therefor, which can reduce current charged/discharged to bit lines because of charge recycling in order to improve the data holding characteristic of a cell capacitor and to reduce current consumption in stand-by mode. For the restore operation, a higher-voltage-side drive wire of the sense amplifier group is switched to a second voltage (V2). Charge stored in a recycling capacitor is used for charging bit lines from an equalizing voltage to the second voltage (V2). Next, the higher-voltage-side drive wire is switched from the second voltage (V2) to a first voltage (V1) so that a memory cell is restored. For the equalizing operation, the higher-voltage-side drive wire is switched to the second voltage (V2), and the charge in the bit lines is returned to the recycling capacitor. After that, the sense amplifying operation is terminated, and the bit line pair is shorted so as to be equalized to ½ of the second voltage (V2).

26 Claims, 12 Drawing Sheets

CIRCUIT DIAGRAM SHOWING FIRST EMBODIMENT

FIG.2 CHANGES IN VOLTAGE FOR DATA "1" (FIRST VOLTAGE (V1)) IN MEMORY CELL CAPACITOR WITH RESPECT TO TIME (LEAK CHARACTERISTIC OF MEMORY CELL CAPACITOR)

FIG.5 OPERATION WAVEFORM DIAGRAM DIRECTED TO FIRST EMBODIMENT

FIG.6 CIRCUIT DIAGRAM SHOWING FIRST SPECIFIC EXAMPLE ACCORDING TO FIRST EMBODIMENT

FIG.7 CIRCUIT DIAGRAM SHOWING SECOND SPECIFIC EXAMPLE ACCORDING TO FIRST EMBODIMENT

FIG.8 CIRCUIT DIAGRAM SHOWING THIRD SPECIFIC EXAMPLE ACCORDING TO FIRST EMBODIMENT

FIG.9 CIRCUIT DIAGRAM SHOWING FOURTH SPECIFIC EXAMPLE ACCORDING TO FIRST EMBODIMANT

FIG.10 OPERATION WAVEFORM DIAGRAM DIRECTED TO SECOND EMBODIMENT

CIRCUIT DIAGRAM OF RELATED ART

OPERATION WAVEFORM DIAGRAM DIRECTED TO RELATED ART

SEMICONDUCTOR MEMORY DEVICE AND DATA ACCESS METHOD FOR SEMICONDUCTOR MEMORY DEVICE

BACKGROUND OF THE INVENTION

1. Field of the Invention

The present invention relates to a semiconductor memory device requiring a refresh operation and in particular to data access control for reducing current consumption through a refresh operation in stand-by mode.

2. Description of the Related Art

In a semiconductor memory device requiring a refresh operation, such as a dynamic random access memory (called DRAM hereinafter), current to be charged/discharged to bit lines for sense amplifiers occupies a large ratio in the current consumption involved in access operations to memory cells. The access operations may be, for example, reading operation, writing operation and refresh operation. Thus, the reduction of current charged/discharged to bit lines has been attempted conventionally.

As one of those approaches to the current reduction, the reduction of the current consumption is being attempted by recycling and reusing the current charged/discharged to the bit lines. As one example, a charge recycling method disclosed in Japanese Laid-Open Patent Publication No. 8-249885 is shown in a circuit configuration diagram in FIG. 11 and an operational waveform diagram in FIG. 12.

FIG. 11 shows the disclosed circuit specification. Here, when VSS indicates a reference voltage, both drive lines SAP and /SAN of sense amplifiers are shorted by an equalizing signal (/EQL0 to /EQL(k−1)). Then, bit line pairs (BL0,/BL0 to BL(m−1),/BL(m−1)) are precharged to the (½)VCC. A large capacitor C2 having a potential voltage Vm2 between the VSS and (½)VCC precharge is connected between the sense amplifier drive line /SAN through a second switching element (SEN00 to SEN0(k−1)) and a power supply. Additionally, a large capacitor C1 having a potential voltage Vm1 between the VCC and the (½) VCC precharge is connected between the sense amplifier drive line SAP through a fourth switching element (/SEP00 to /SEP0(k−1)) and a power supply. Here, Vm1=(¾)VCC and Vm2=(¼) VCC are desirable voltage values.

FIG. 12 is an access operation example in the circuit configuration shown in FIG. 11. In FIG. 12, a cell array 0 is illustrated as an example. For a restore operation for rewriting charge to the memory cell, first of all, as an amplifying operation by the sense amplifier, the /SEP00 is turned to Low while the SEN00 is turned to High. Then, the SAP is coupled to Vm1 while the /SAN is coupled to Vm2. In this case, when a total sum of stray capacitance (as CB) for half of all bit lines within the cell array 0 satisfies C1>>CB and C2>>CB, the potential voltage of the SAP becomes Vm1 substantially, while the potential voltage of the /SAN becomes Vm2 substantially. In other words, the sense amplifier is driven between Vm1(=(¾)VCC) and Vm2(=(¼)VCC). Next, the /SEP00 and the SEN00 are returned to High and Low, respectively. Then, the /SEP10 and the SEN10 are turned to Low and High, respectively. The sense amplifier is driven between VCC voltage and VSS voltage so that VCC voltage is written in the memory cell.

For equalization, the /SEP10 and the SEN10 are returned to High and Low, respectively. Then, the /SEP00 and the SEN00 are turned to Low and High, respectively. It serves to return to capacitors C1 and C2 charges supplied from capacitors C1 and C2 to the bit lines at the time of the restoration. In other words, the recycling of charges are performed. After that, the /SEP00 and the SEN00 are returned to High and Low, respectively. Then, the /EQL0 is turned to High while the /SAN and the SAP are shorted.

With respect to each of the /SAN side and the SAP side, a charge of (¼)VCC voltage in the capacitors C1 and C2 are recycled. Therefore, charges of (½)VCC voltage which is equal to half of the restore voltage to the memory cells are recycled totally, which can reduce the current charged/discharged to the bit lines.

Multiple potential voltages and switches may be provided, which are different from the potential voltages Vm1 and Vm2 so that the potential voltage can be switched at multiple levels (such as n levels). Thus, 1/n power reduction is possible in principle.

The Japanese Laid-Open Patent publication No. 8-249885 discloses a VCC precharge method and a VSS precharge method in addition to the (½)VCC precharge method with respect to equalizing voltage of bit lines. However, margins for reading out respective data "1" and "0" cannot be obtained in case the circuit approach for the precharge voltages is made such that, firstly, stored charges in the cell capacitor are read out on bit lines, next, charge re-distribution is made, and after that, differential amplification is applied to charges between complimentary bit lines by a sense amplifier to read out data. In order to obtain the margins for reading out both data "1" and "0", the equalizing voltage of the bit lines must be middle potential between the VCC and VSS. In a general circuit design, the equalizing voltage is the (½)VCC voltage, which is obtained by shorting a pair of bit lines having voltages Vcc and VSS. This approach is adopted in the circuit configuration diagram shown in FIG. 11. Therefore, in the technology of the related art, shown in FIG. 11, the reduction of current charged/discharged to bit lines is achieved through the charge recycling by assuming the equalizing voltage of (½)VCC.

In the recent mobile apparatus industries, a semiconductor memory device having large capacity is required with the increase in functions mounted therein. The semiconductor memory device has to be implemented in a limited space at a practical price. Therefore, a DRAM or a synchronous DRAM (called SDRAM, hereinafter), which is highly integrated and is inexpensive for each bit, has been adopted in the mobile apparatus. On the other hand, mobile apparatuses, such as a mobile phone and a digital camera tend to be in stand-by mode for a long period of time. Thus, the reduction of the current consumption in stand-by mode is required to the limit in order to improve the successive useable time characteristic when the battery is driven. Therefore, required is the reduction of the current consumed by refresh operations such as a self-refresh operation, which are performed at intervals of a certain period of time even in stand-by mode in a DRAM, for example.

However, in the circuit configuration diagram (FIG. 11) showing the technology of the related art, the amount of recycled charges is (½)VCC, which is half of the VCC voltage. The reduction effect of the current consumption is limited to ½ of the current consumption relating to current charged/discharged to bit lines of all consumed current involved in refresh operations. That is, the reduction effect of the current consumption is obtained partially, and more reduction is not possible.

Two capacitors C1 and C2 having two voltages of a High-side voltage Vm1 and a Low side voltage Vm2 are connected to a pair of the drive lines SAP and /SAN, respectively, of the sense amplifier so that the pair of bit lines in the cell array 0 is differential-amplified. Here, in order to charge/discharge to the substantial High side voltage Vm1 and the substantial Low side voltage Vm2 for each half number of bit lines, the capacitors C1 and C2 must have larger enough capacitance value than the total stray capacitance value CB of the half number of bit lines. Each cell array must have two capacitors having large capacitance, which may not be achieved in a realistic die size.

In addition, it has been known that the current consumption can be reduced to 1/n in principle by switching the potential voltage in n levels. However, a capacitor and a switch are required for each potential voltage in order to supply current to each potential voltage. In order to switch the n-levels of potential voltages sequentially, a capacitor is required for each potential voltage in the SAP side and the /SAN side. Thus, 2n capacitors having large capacitance are required, which may not be achieved in a realistic die-size.

The current consumed by the refresh operation occupies a large ratio of the current consumption in stand-by mode. A long refresh cycle is required by improving the data holding characteristic so as to reduce the current consumption in stand-by mode. Here, the data holding characteristic is reduced with the passage of time because the stored charges of the high-level voltage accumulated in the cell capacitor leaks. Data holding time tREF is defined as the time when the high-level voltage of the cell capacitor is reduced gradually and goes under the equalizing voltage of the bit line due to the leak. When the cell capacitor and the bit line are connected after the expiration of the data holding time tREF, inversion data may be amplified. Thus, the refresh operation must be performed before the expiration of the data holding time tREF.

If the data holding time tREF can be increased, the refresh cycle can be also increased. Thus, the current consumption involved in the refresh operation can be reduced. In order to increase the data holding time tREF, assuming that the voltage for writing data "1" into the cell capacitor is not varied, the equalizing voltage of the bit lime must be reduced. However, in the technology of the related art, when the SAP of voltage (¾)VCC and the /SAN of the voltage (¼)VCC are shorted by an equalizing signal /EQL0, the equalizing voltage of the bit line is fixed to (½)VCC. As a result, the equalizing voltage of the bit line cannot be reduced.

Here, when it is attempted to shift the bit line to much lower voltage value after the bit line is equalized to the voltage (½)VCC, the bit line voltage must be discharged. As a result new current consumption is caused, which is converse to the reduction of current consumption. Assuming that the equalizing voltage can be set to lower voltage than (½)VCC, the charge recycling operation is not performed properly during the next access operation.

Since a large memory capacity needs to be implemented in a limited space in a mobile apparatus, finer and highly integrated DRAM, for example, is attempted. Thus, the cell size must be reduced, which may deteriorates the data holding time tREF due to leaking, for example. The equalizing voltage for the bit line must be reduced in order to improve the data holding time tREF, which is not possible in the technology of the related art. This is problematic.

SUMMARY OF THE INVENTION

The present invention was made in order to overcome the problems of the technology of the related art. It is an object of the present invention to provide a semiconductor memory device and a data access method for the semiconductor memory device, which can reduce current consumption in stand-by mode by reducing current charged/discharged to bit lines by means of a charge recycling technology and by reducing a number of refresh operations within a certain period of time through the improvement in the data holding characteristic of a cell capacitor.

In order to achieve the object, according to one aspect to the present invention, there is provided a semiconductor memory device, comprising an activation unit arranged for each predetermined bit line pairs; a sense amplifier group for differentially amplifying each bit line pair within the activation unit by using, as a reference voltage, a lower-side voltage supplied to a lower-voltage-side drive wire; a voltage supplying section for supplying a first voltage, which is a restore voltage to memory cells, to a higher-voltage-side drive wire of the sense amplifier group; and equalizing sections for equalizing the bit line pairs to an intermediate voltage, which is lower than ½ of the first voltage, wherein the voltage supplying section includes at least one first voltage supply section for supplying the first voltage and at least one the second voltage supplying section for supplying a second voltage, which is lower than the first voltage.

In the semiconductor memory device, each of the bit line pairs may be equalized to an intermediate voltage lower than ½ of the first voltage, which is a restore voltage to a memory cell. Bit lines in the higher-voltage side among each of bit line pairs may be differentially amplified to the second voltage by recycling charge from the second voltage supply section and may be differentially amplified by the first voltage, which is supplied from the first voltage supply section. Thus, each of the bit line pairs can be amplified to the first voltage. On the other hand, bit lines in the higher-voltage side of each of the bit line pairs may restore charge to the second voltage supply section so that each of the bit line pairs maintained at the first voltage can be turned to the second voltage. After that, it is equalized to the intermediate voltage.

In a data access method for a semiconductor memory device according to the one aspect of the present invention, a lower-side voltage supplied to a lower-voltage-side drive wire of a sense amplifier group is used as a reference voltage, and bit line pairs are activated and controlled for each of the bit line pairs so that the sense amplifier group is differentially amplified. Each of the bit line pairs is equalized to an intermediate voltage lower than ½ of the first voltage by switching a higher-voltage-side drive wire of the sense amplifier group from the first voltage to a second voltage lower than the first voltage, and storing charge discharged from the first voltage to the second voltage. For restoration, after the higher-voltage-side drive wire is switched to the second voltage and is differentially amplified, and charge charged from the intermediate voltage to the second voltage is reused, the higher-voltage-side drive wire is switched to the first voltage and is differentially amplified.

When each of bit line pairs is activated and is controlled to be differentially amplified by a sense amplifier group by using a lower-side voltage charged to a lower-voltage-side drive wire of the sense amplifier group as a reference voltage, there are performed the following processes in one cycle, namely: a word line activating process for activating a word line; a charge reusing and activating process for supplying a second voltage lower than the first voltage to the higher-voltage-side drive wire and then activating the sense amplifier group; a restoring and activating process for, after each of the bit line pairs is differentially amplified to the second voltage, supplying the first voltage instead of the second voltage to the higher-voltage-side drive wire and then activating the sense amplifier group; a word line deactivating process for deactivating the word line after the memory cell is restored to the first voltage; a charge restoring process for supplying the second voltage instead of the first voltage to the higher-voltage-side drive wire; a deactivating process for terminating voltage supply to the higher-voltage-side drive wire and then deactivating the sense amplifier group when voltages of bit lines included in each of the bit line pairs are the second voltage and the lower-side voltage; and an equalizing process for equalizing each of the bit line pairs to an intermediate voltage lower than ½ of the first voltage.

Here, the deactivating process for deactivating the sense amplifier group and the equalizing process for equalizing each of the bit line pairs to the intermediate voltage lower than ½ of the first voltage may be arranged to perform at the same time. Alternatively, the equalizing process may be performed after the deactivating process.

Thus, when differential amplification is performed on each of the bit line pairs, the higher-voltage-side drive wire of the sense amplifier group may be switched through two stages from the equalizing voltage to the second voltage and to the first voltage, which is a restore voltage to the memory cell. Thus, the reuse of charge from the equalizing voltage to the second voltage for restoration and the restoration of charge from the first voltage to the second voltage for equalization may be repeated alternately for bit lines in the higher-voltage side of each of the bit line pairs. Then, charge can be recycled so that the current charged/discharged to bit lines can be reduced.

Since the equalizing voltage is set at a voltage lower than ½ of the first voltage, a voltage difference from the restore voltage to the memory cell, that is, the first voltage, which is a voltage level for data "1" stored in the memory cell capacitor becomes larger. Thus, the data holding time becomes longer, which can improve the data holding characteristic. As a result, the number of refresh operations within a certain period of time can be reduced, and the current consumption involved in refresh operations can be reduced.

When the semiconductor memory device is used for a mobile apparatus, for example, because of the reduction of current charged/discharged to the bit lines through charge recycling and the improvement in data holding characteristic, the current consumption in stand-by mode can be reduced. Thus, the continuous usable time in battery driven mode can be improved.

A data access method for a semiconductor memory device according to another aspect of the present invention includes the steps of activating a word line in response to a command from the out side for an activation unit, which is activated and is controlled for each of bit lines, using a lower-side voltage supplied to a lower-voltage-side drive wire in a sense amplifier group as a reference voltage, supplying a first voltage, which is a restore voltage for a memory cell, to a higher-voltage-side drive wire so that the bit line pairs can be differentially amplified, and accessing a predetermined bit number of data successively in accordance with subsequent successive access commands, wherein the method further comprises the steps of driving the higher-voltage-side drive wire by a second voltage lower than the first voltage, differentially amplifying each of bit line pairs so that charge can be reused for charging from the equalizing voltage to the second voltage, driving the higher-voltage-side drive wire by the first voltage for restoring a memory cell, in parallel with successive accesses to a predetermined bit number of data, deactivating the word line switching the higher-voltage-side drive wire from the first voltage to the second voltage, recharging charge by discharging from the first voltage to the second voltage, and equalizing each of the bit line pairs to the intermediate voltage lower than ½ of the first voltage after the restoration of charge.

A data access method for a semiconductor memory device, includes the steps of, for an activation unit in which each of bit line pairs is activated and is controlled, activating a word line in response to a command from the outside, using, as a reference voltage, lower-side voltage supplied to a lower-voltage-side drive wire in a sense amplifier group to supply a first voltage, which is a restore voltage to a memory cell, to a higher-voltage-side drive wire and then to differentially amplify the bit line pairs, accessing a predetermined bit number of data successively in response to subsequent, successive access commands, and restoring to the memory cell by having a charge reusing and activating process for supplying a second voltage, which is lower than the first voltage, to the higher-voltage-side drive wire and then activating the sense amplifier group, and after differentially amplifying each of bit line pairs by the second voltage, a restoring and activating process for supplying the first voltage instead of the second voltage to the higher-voltage-side drive wire. After that, the method further includes a successive-access process for accessing the predetermined bit number of data successively, a word line deactivating process for deactivating the word line in parallel with the successive-access process, a charge restoring process for supplying the second voltage instead of the first voltage to the higher-voltage-side drive wire, a deactivating process for terminating voltage supply to the higher-voltage-side drive wire and for deactivating the sense amplifier group, and an equalizing process for equalizing each of the bit line pairs to an intermediate voltage, which is lower than ½ of the first voltage according to the timing after the charge restoring process.

Accordingly, when the reduction of the current charged/discharged to the bit lines through charge recycling for bit lines of the high voltage side of each pair of bit lines and the improvement of the data holding characteristic by setting the equalizing voltage to a voltage lower than ½ of a first voltage are applied to successive access operation, a first level of two levels of equalizing operation can be embedded in the successive access operation. Thus, the cycle time characteristic, for example, can be reduced. In the semiconductor memory device having successive access operation such as a burst operation, the current consumption in stand-by mode can be reduced significantly. When the semiconductor memory device is applied to a mobile apparatus, the successively usable time can be improved significantly in battery drive mode.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

An embodiment embodying a semiconductor memory device and a data access method for the semiconductor memory device according to the present invention will be described in detail with reference to accompanying drawings.

Figure 1:
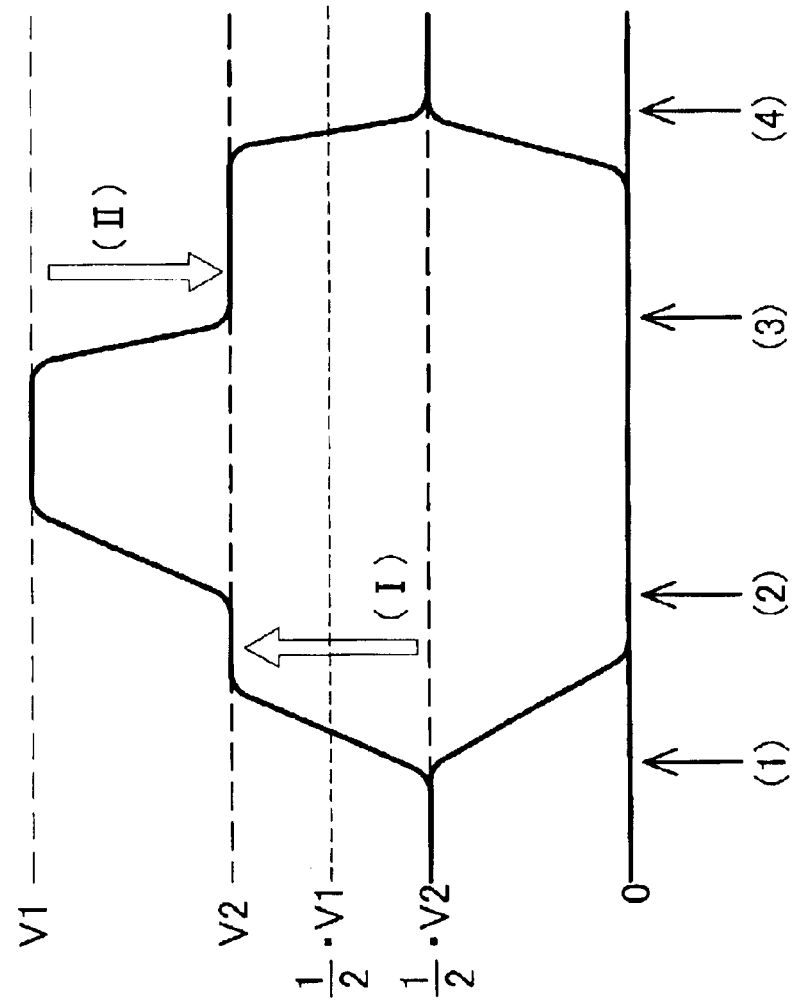
FIG. 1 is a waveform diagram showing a pair of bit lines, describing the principle of the present invention.

A principle of the present invention is shown in FIG. 1. FIG. 1 shows a restore-operation waveform when a restore-operation is performed on a memory cell and an equalize-operation waveform when a pair of bit lines is equalized. In equalize mode, a pair of bit lines is equalized to ½ voltage ((½)V2) of a second voltage (V2), which is lower than ½ voltage ((½)V1) of a first voltage (V1). When a word line is activated (not shown) and a restore-operation is starts to be performed, a higher-voltage-side drive wire of a sense amplifier group is switched to the second voltage (V2) the pair of bit lines are differentially amplified (FIG. 1, (1)). Here, charges stored in charge-recycling means (not shown) included in the second voltage (V2) are used for charging one of the pair of bit lines from the equalizing voltage ((½)V2) to the second voltage (V2) (FIG. 1, (I)). Next, the higher-voltage-side drive wire of the sense amplifier group is switched from the second voltage (V2) to the first voltage (V1) so that the pair of bit lines are differentially amplified and a restore-operation is performed on the memory cell (FIG. 1, (2)) Here, charges are supplied from the first voltage (V1).

After the restore-operation on the memory cell, the word line is deactivated (not shown) and an equalize operation is initiated. As a first stage (FIG. 1, (3)), the higher-voltage-side drive wire of the sense amplifier group is switched from the first voltage (V1) to the second voltage (V2). Here, the charges, which are supplied from the first voltage (V1) to one of the pair of bit lines, are returned to the second voltage (V2). Then, the charges are restored in the charge-recycling means (FIG. 1, (II)). At a subsequent second stage (FIG. 1, (4)), the sense amplifying operation is terminated, and the pair of bit lines are equalized. By equalizing the second voltage (V2) with the reference voltage (0), the equalizing voltage becomes ½ voltage ((½)V2) of the second voltage (V2). Hence the equalizing voltage is lower than ½ voltage ((½)V1) of the first voltage (V1). Charges stored by the charge-restore operation at the time of the equalization (FIG. 1 (II)) are reused for the charge-reuse operation (FIG. 1, (I)) at the time of restore in the next cycle so that the operation for recycling charges can be performed.

Figure 2:
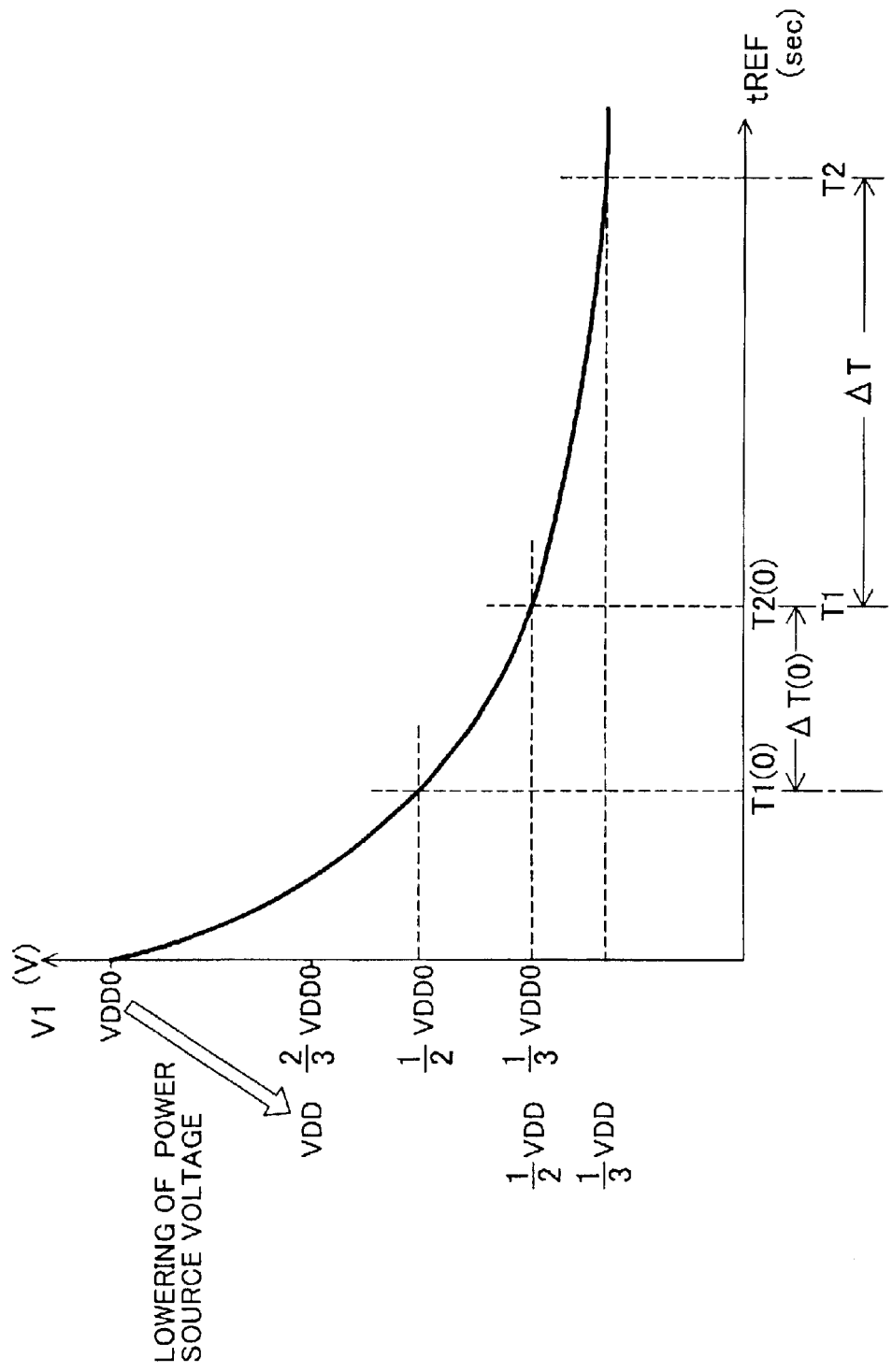
FIG. 2 is a characteristic diagram showing changes in voltage for data "1" (first voltage) in a memory cell capacitor with respect to time.

FIG. 2 shows a leak characteristic of charges stored at the first voltage (V1), which is the data "1" voltage. Charges stored in the memory cell capacitor leak with the passage of time due to the characteristic in accordance with a condition for producing each semiconductor memory device and device conditions. Thus, the voltage of the cell capacitor is reduced with the passage of time. The data "1" is read out by reading out the cell capacitor at the first voltage (V1) to a bit line at equalizing voltage and differentially amplifying the cell capacitor with respect to the reference bit line at the equalizing voltages. Therefore, in order to perform differential amplification properly, it is an essential condition that a voltage value of the bit line is not lower than the equalizing voltage when the data "1" of a cell capacitor is read out to the bit line. The refresh operation must be performed before the voltage of the cell capacitor reaches the equalizing voltage.

Assuming that the first voltage is a power source voltage VDD0, tREF(=T2(0)) when the equalizing voltage is changed to (⅓)VDD0 Voltage has a longer tREF time by ΔT(0) than tREF(=T1(0)) until the cell capacitor voltage reaches to the (½)VDD0 voltage, which is a conventional, general equalizing voltage setting. This means that the refresh cycle becomes longer. Then, the number of times of refresh operations for each unit time is reduced, which can allow lower current consumption in stand-by mode. When the first voltage (V1) is reduced from the VDD0 to the VDD, which is much lower (FIG. 2 shows a case where VDD= (⅔)VDD0), the time difference (ΔT) is much larger between the tREF(=T1) when the equalizing voltage is the (½)VDD voltage and the tREF(=T2) when the equalizing voltage is the (⅓)VDD voltage. Then, the reduction of the number of times of the refresh operations for each unit time is much larger because of the longer refresh cycle, which allows the larger effect of the lower current consumption in stand-by mode.

This means that the effect of improving the data holding characteristic becomes larger with the reduction of the first voltage (V1), which is the restore voltage memory cells, by setting the equalizing voltage lower than ½ of the first voltage (V1). Especially, in order to achieve the higher integration and fineness and the lower power consuming operations in response to the request for the application of a large capacity mobile apparatus, the drive voltage is necessarily reduced. In view of the background, the lower equalize voltage has a big effect for reducing current consumption in stand-by mode because of the reduction of the refresh operation current. Furthermore, in order to develop the reduction of stand-by current in the mobile equipment industry, in which the drive voltage has been reduced, the importance thereof is increased still more.

Figure 3:
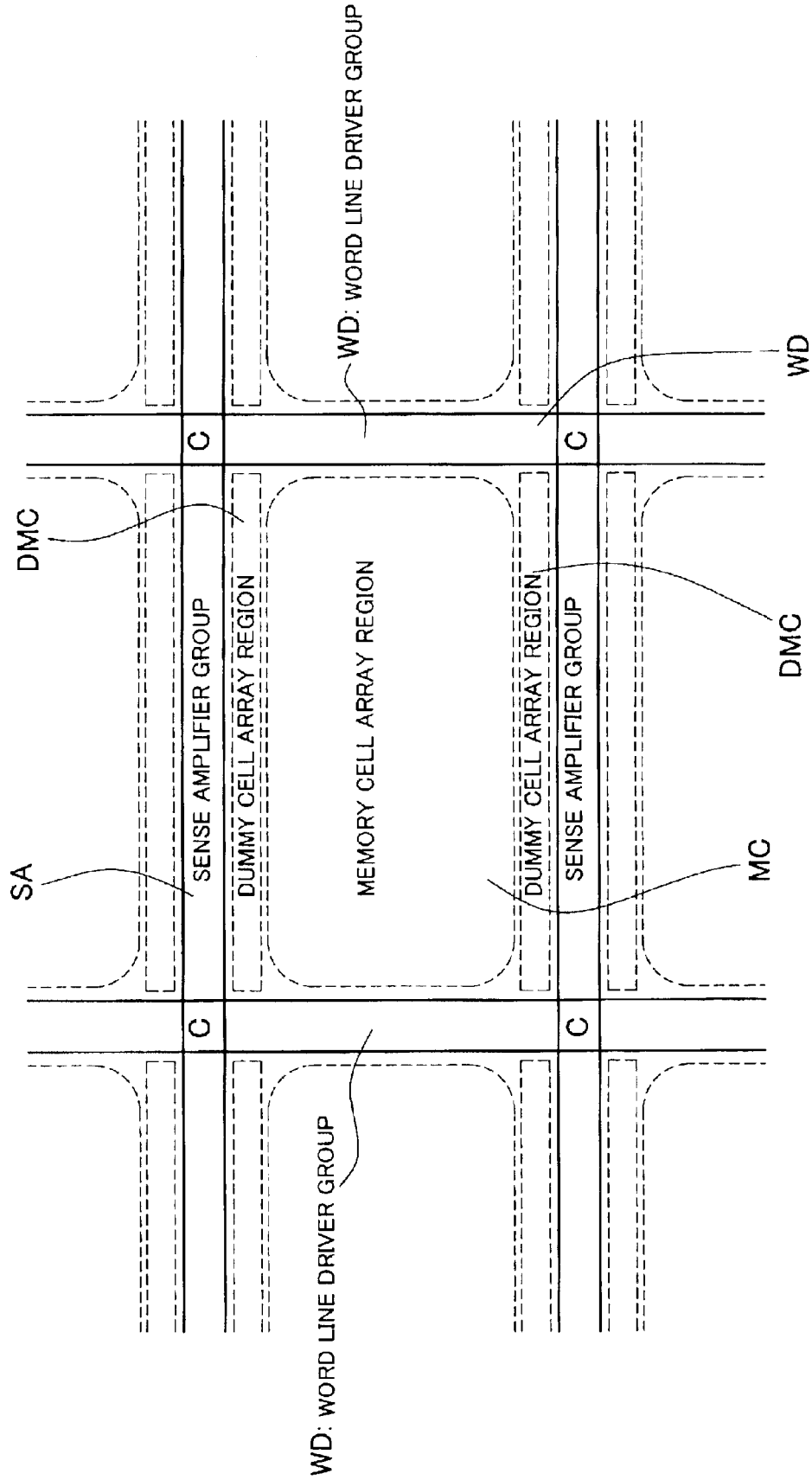
FIG. 3 is a layout diagram showing the construction of a memory cell array.

In the layout diagram shown in FIG. 3, a part of the structure of a memory cell array in a semiconductor memory device is magnified schematically. A memory cell array is provided as a memory cell array region MC for each predetermined number of bits, and the memory cell array region MC is used as an active unit for constructing a unit of data accesses. Memory cells, not shown, are arranged in matrix form in the memory cell array region MC. Each memory cell is connected to each of multiple pairs of bit lines, which are differentially amplified by the sense amplifier group SA. The connection control over the memory cells and bit lines are performed by multiple word lines, each of which is selected by word line driver group WD. Each of multiple word lines is wired such that a memory cell connected to either one bit line of each of pairs of bit lines can be selected commonly. Furthermore, each of adjacent word lines is wired such that memory cells connected to the other bit line of each of pairs of bit lines can be selected commonly. By selecting multiple memory cells by one word line, either one bit line of each of pairs of bit lines and the memory cells are conducted, and the sense amplifier group SA is activated at the same time. Then, a restore operation and an equalize operation after an access are performed on bit line pairs at the same time.

In the memory cell array region MC, a word line driver group WD and a sense amplifier group SA or a cell capacitor structure, which is generally not exist in the peripheral region such as a peripheral-control-circuit region (not shown), are provided for each memory cell in the memory cell array region in matrix form. The cell capacitor structure has a special kind of oxide film including a nitride film and a special kind of device structure such as a trench structure and a stack structure in response to the need for holding a capacitance value. Therefore, the memory cell array region MC has a different device structure from that of the peripheral region. Generally, the stack height from the semiconductor substrate is also different. As a result, variation in device characteristics of the cell capacitor, for example, may occur easily at the border with respect to the peripheral regions of the word line driver group WD and the sense amplifier group SA, where the continuity of the structure of the memory cell array region MC is interrupted. In order to avoid the variation and to construct a uniform cell capacitor, it is general to provide, in the peripheral portion of the memory cell array region MC, a dummy cell array region DMC in which a dummy cell capacitor having a structure equivalent to that of the cell capacitor is arranged. Thus, the differences in device structure are absorbed by the dummy cell array region DMC, and the uniformity of the device characteristic of the memory cell array region MC can be maintained.

An activating portion of the sense amplifier group SA is provided in a crossover region C between the word line driver group WD and the sense amplifier group SA. An NMOS transistor is provided therein as a voltage supplying section for supplying a reference voltage to the lower-voltage-side drive wire of the sense amplifier group. Furthermore, first and second voltage supply sections are provided therein for supplying first and second voltages to the higher-voltage-side drive wire of the sense amplifier group.

Figure 4:
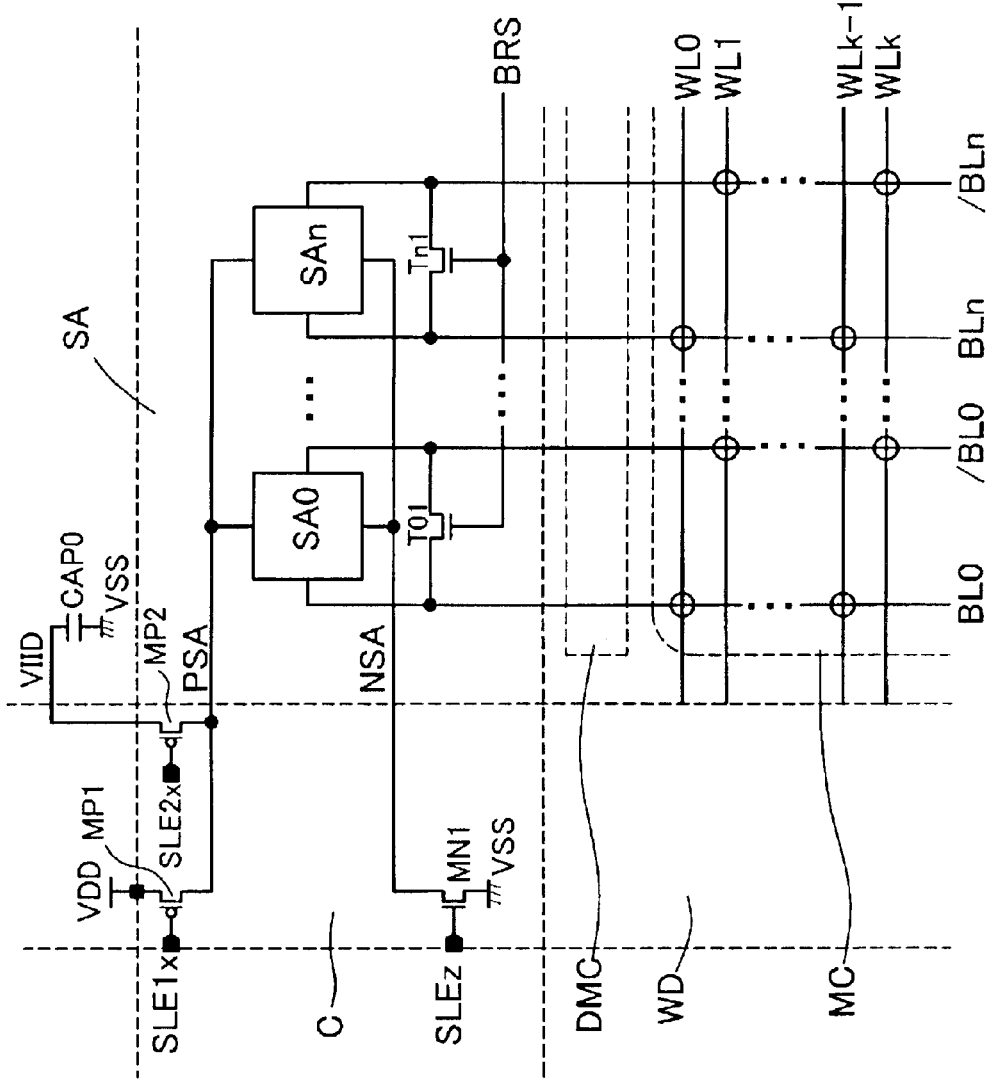
FIG. 4 is a circuit diagram showing a first embodiment.

According to the first embodiment shown in FIG. 4, multiple sense amplifiers SA0 to SAn are provided in the sense amplifier group SA. Pairs of bit lines BL0,/BL0 to BLn,/BLn, which are differentially amplified, are connected to the sense amplifiers SA0 to SAn, respectively. The pairs of bit lines BL0,/BL0 to BLn,/BLn are wired to the memory cell array region MC through the dummy cell array region DMC. Memory cells are connected thereto, which are alternately controlled by the word lines WL0, WL1, WLk−1 and WLk from the word line driver group WD. The pairs of bit lines BL0,/BL0 to BLn,/BLn are connected by the NMOS transistors T01 to Tn1, which are successively controlled by an equalizing signal BRS.

A higher-voltage-side drive wire PSA and a lower-voltage-side drive wire NSA of the sense amplifiers SA0 to SAn are put together and wired for each sense amplifier group SA. They are connected to the higher and lower drive voltages, respectively, through a MOS transistor in the crossover region C. More specifically, the lower-voltage-side drive wire NSA is connected to the reference voltage VSS, which is the lower-side voltage through the NMOS transistor MN1 to be controlled by a control signal SLEz.

The higher-voltage-side drive wire PSA is connected to the power source voltage VDD, which is the first voltage, through the PMOS transistor MP1 to be controlled by a control signal SLE1x. Further, the higher-voltage-side drive wire PSA is connected to the second voltage VIID, which is lower than the power source voltage VDD, through the PMOS transistor MP2 to be controlled by the control signal SLE2x. Here, a recycling capacitor CAP0 is connected, as the charge-recycling means, between the second voltage VIID and the reference voltage VSS. The position for locating recycling capacitor CAP0 is not specified. However, it may be located in the crossover region C, in one of neighboring regions of the sense amplifiers SA0 to SAn in the sense amplifier group SA, as describer later, or in the dummy cell array region DMC. The second voltage VIID may be supplied from the outside of the semiconductor memory device. Alternatively, it may be created by being stepped down from the power source voltage VDD by an internal step-down power source circuit. The power source voltage VDD, which is the first voltage, and the second voltage VIID are set for the reference voltage VSS, which is the lower-side voltage.

Here, stray capacitance is associated with the higher-voltage-side drive wire PSA or each of the bit lines BL0 to /BLn. More specifically, source terminals of the PMOS transistors, not shown, constructing each of the sense amplifiers SA0 to SAn are connected to the higher-voltage-side drive wire. For a DRAM, connected to each of the bit lines BL0 to /BLn is drain terminals of transfer gates constructing the NMOS transistors for performing connection control over the cell capacitors through word lines WL0 to WLk. These junction capacitances are added as stray capacitance. For the recent larger capacity of the semiconductor memory device, the number of memory cells has been increased, which are connected to the higher-voltage-side drive wire PSA and/or a bit line. As a result, the stray capacitance due to the junction capacitance has been increased. In addition, due to the increase in die size for the larger capacity, the wire length of each of the bit lines BL0 to /BLn becomes longer. The stray capacitance is furthermore increased due to the line-to line capacitance with respect to adjacent wires for fineness and due to the inter-layer capacitance in a multi-level structure.

However, the value of the stray capacitance of the bit lines BL0 to /BLn is much larger than that of the stray capacitance of the higher-voltage-side drive wire PSA. The stray capacity of the higher-voltage-side drive wire PSA depends on the number of sense amplifiers SA0 to SAn. On the other hand, for the stray capacitance of the bit lines BL0 to /BLn, many memory cells are connected to each of a pair of bit lines BL0 to /BLn, which is connected to each sense amplifiers SA0 to SAn, and, when they are substantially amplified, ½ of the total number of the bit lines BL0 to /BLn is added as stray capacitance.

An operation according to the first embodiment will be described with reference to the operation waveform diagram shown in FIG. 5. For convenience, a pair of bit lines BL0,/BL0 is used as an example for the description in FIG. 5. In the circuit configuration, all of pairs of bit lines BL0,/BL0 to BLn,/BLn in the memory cell array region MC, which is an activation unit, are controlled for the activation at the same time. The pairs of bit lines BL0,/BL0 to BLn,/BLn in precharge mode before starting an access are equalized to the equalizing voltage VPR. Then, the pairs of bit lines BL0,/BL0 to BLn,/BLn shift to floating mode when an equalizing signal BRS is changed to a low logic level at the end of the equalizing mode and the NMOS transistors T01 to Tn1 are turned OFF.

After that, a restore operation starts to be performed. A word line WL0 is activated by the step-up voltage VPP. Then, stored charges are re-distributed from the memory cell to the bit lines BL0 to BLn. FIG. 5 shows a case where the stored charges for data "1" are re-distributed and the voltage of the bit line BL0 is increased from the equalizing voltage VPR. When the stored charges for data "0" are re-distributed, the voltage of the bit line is decreased from the equalizing voltage VPR. Relatively, the voltage of the complement bit line becomes the higher voltage. Here, since the stray capacitance of the bit line is larger than the cell capacitor capacitance, an amount of voltage shift between the pairs of the BL0,/BL0 to BLn,/BLn is minute.

Next, the minute voltage difference between the pairs of bit lines BL0,/BL0 to BLn,/BLn is differentially amplified by the sense amplifiers SA0 to SAn. Then, the control signal SLEz is activated, and the NMOS transistor MN1 is turned on. Thus, the reference voltage VSS is supplied to the lower-voltage-side drive wire NSA of the sense amplifiers SA0 to SAn. In addition, the control signal SLE2x is activated, and the PMOS transistor MP2 is turned ON. Thus, the second voltage VIID is supplied to the higher-voltage-side drive wire PSA, and then the first stage of the restore operation starts to be performed. Thus, the sense amplifiers SA0 to SAn differentially amplify the pairs of bit lines BL0,/BL0 to BLn,/BLn between the second voltage VIID and the reference voltage VSS.

Here, the differential amplification in the sense amplifiers SA0 to SAn is an operation for charging/discharging to the stray capacitance associated with each of the pairs of bit lines BL0,/BL0 to BLn,/BLn. Therefore, the voltage of the bit line in the lower voltage side is stepped down to the reference voltage VSS by discharging charge to the reference voltage VSS. On the other hand, the voltage of the bit line in the higher voltage side is stepped up by redistributing charge, which is stored in the recycling capacitor CAP0 connected to the second voltage VIID; to the capacitance load (FIG. 5, (I)). The stray capacitance of the bit line BL0 to BLn mainly having a total sum of the stray capacity is added to the stray capacitance of the higher-voltage-side drive wire PSA.

Here, the capacitance value of the recycling capacitor CAP0 is made larger than the total sum of the stray capacitance in order to maintain the voltage of the higher-voltage-side drive wire PSA, that is the bit line voltage in the higher-voltage-side, after the redistribution at the second voltage VIID substantially. Thus, even after the redistribution of charge from the recycling capacitor CAP0, the voltage of the higher-voltage-side drive wire PSA and the bit line in the higher-voltage side can be maintained at the second voltage VIID substantially. The first stage of the restore operation, which is the differential amplifying operation to the substantial second voltage VIID by the sense amplifiers SA0 to SAn is performed during a period when the control signal SLE2x is activated (FIG. 5, (1)). During the period, the bit line in the higher-voltage side is charged to the substantial second voltage VIID.

The control signal SLE2x shifts to the high logic level and the activation state ends. After that, the control signal SLE1x shifts to the low logic level, and the voltage source connected to the higher-voltage-side drive wire PSA is switched to the power source voltage VDD, which is the first voltage, from the second voltage VIID. Then, the second stage of the restore operation is initialized. In the second stage of the restore operation, the bit lines in the higher-voltage side, which are amplified to the substantial second voltage VIID, are further amplified by the sense amplifiers SA0 to SAn to the power source voltage VDD. Then, the restore operation ends (FIG. 5, (2)). Under this condition, the word line WL0 is activated to the step-up voltage VPP. Therefore, the memory cell capacitors are also conducted to the bit lines, which are maintained at the power source voltage VDD, through the transfer gate. The cell capacitors are charged to the power source voltage VDD so that the restore operation is performed on the memory cells.

After writing in the cell capacitors, an equalize operation is initialized. The control signal SLE1x is deactivated. Then, the control signal SLE2x shifts to the low logic level and is activated again. The higher-voltage-side drive wire PSA is connected to the second voltage VIID so that the first stage of the equalize operation is initialized (FIG. 5, (3)). The stored charge in the recycling capacitor CAP0 supplies charge to the bit line in the first stage (FIG. 5, (1)) of the restore operation, and therefore the amount of the stored charge is reduced. However, at the time of the connection to the second voltage VIID of the higher-voltage-side drive wire PSA, the higher-voltage-side drive wire PSA and the bit lines in the higher voltage side are maintained at the power source voltage VDD. Therefore, charge moves from the stray capacitance of the bit lines to the recycling capacitor CAP0 through the higher-voltage-side drive wire PSA. When charge is returned to the recycling capacitor CAP0, the bit line voltage in the higher voltage side is stepped down from the power source voltage VDD to the substantial second voltage VIID thereby (FIG. 5, (II)). In the first stage of the restore operation, the higher-voltage-side drive wire PSA is connected to the second voltage VIID so that the bit lines in the higher voltage side are returned to the substantial second voltage VIID. The first stage of the equalize operation is performed (FIG. 5, (3)) during a period when the control signal SLE2x is activated like the first stage (FIG. 5, (1)) of the restore operation. During this period, the bit lines in the higher voltage side are discharged to the substantial second voltage VIID.

Figure 5:
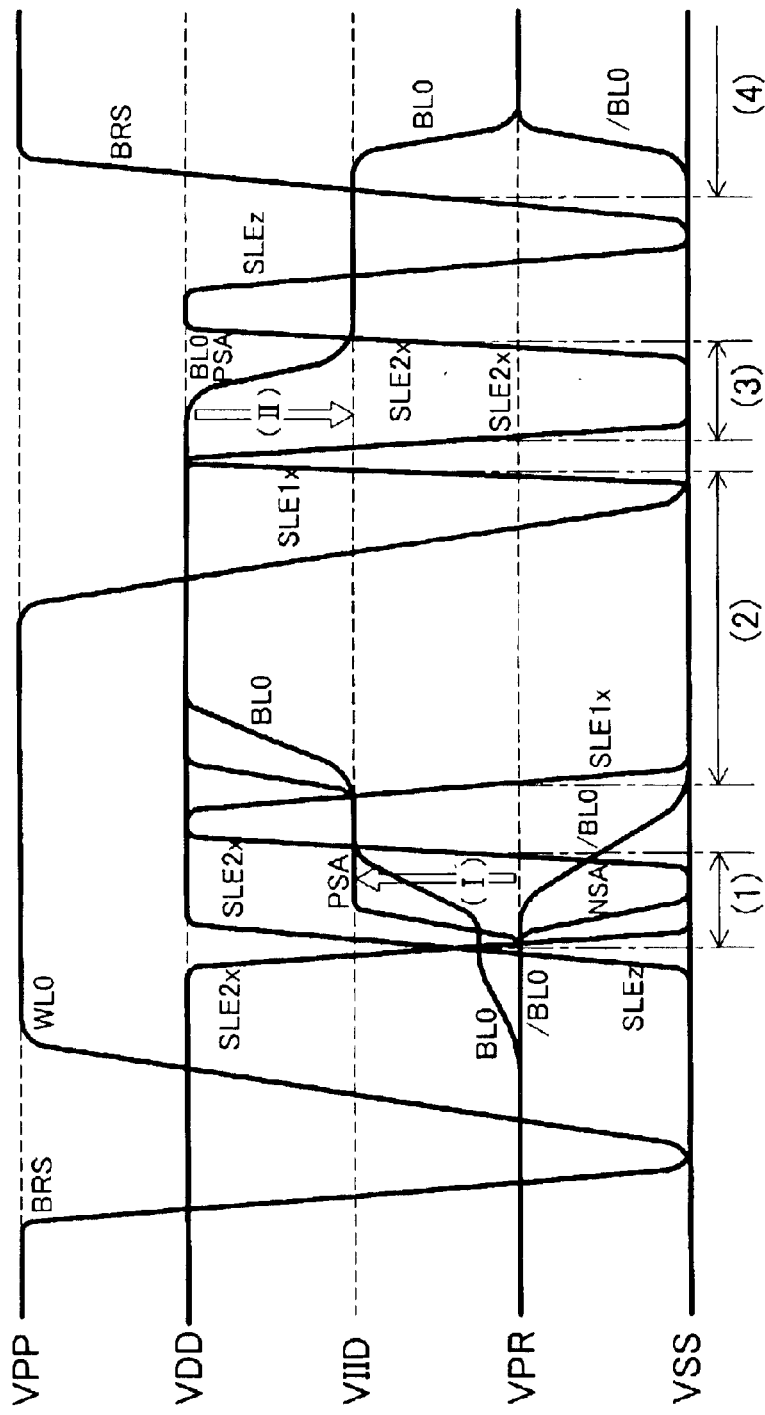
FIG. 5 is an operation waveform diagram showing an operation according to the first embodiment.

Here, if the voltage level of the second voltage VIID is at the substantial center between the power source voltage VDD and the equalizing voltage VPR, the amount of charge supplied to the bit lines in the higher voltage side from the recycling capacitor CAP0 in the first stage (FIG. 5, (I)) of the restore operation is substantially equal to the amount of charge (FIG. 5, (II)) supplied from the bit lines in the higher voltage side to the recycling capacitor CAP0 in the first stage (FIG. 5(3)) of the equalize operation. Then, the charge stored in the recycling capacitor CAP0 can be recycled repeatedly. For example, in terms of specific values, the second voltage VIID may be set to ⅔ of the power source voltage VDD, and the equalizing voltage VPR may be set to ⅓ of the power source voltage VDD.

At the end of the charge recycling, the control signal SLE2x shifts to the high logic level, and the activation state ends. After that, the control signal SLEx shifts to the low logic level, and the deactivation state is started. Furthermore, the equalizing signal BRS shifts to the step-up voltage VPP, and a second stage of the equalize operation is initialized (FIG. 5, (4)). In the second stage of the equalize operation, the pairs of bit lines BL0,/BL0 to BLn,/BLn, which are maintained in the substantial second voltage VIID and the reference voltage VSS, are equalized by the NMOS transistors T01 to Tn1, respectively. Thus, the equalizing voltage VPR of the pairs of the bit lines BL0,/BL0 to BLn,/BLn becomes ½ voltage of the substantial second voltage VIID. The voltage difference between the equalizing voltage VPR and the power source voltage VDD, which is the restore voltage, is large.

The specific construction of the voltage supply to the higher-voltage-side drive wire PSA will be described with reference to first to fourth specific examples. In the first specific example shown in FIG. 6, a PMOS transistor supplying the second voltage VIID to the higher-voltage-side drive wire PSA is provided for each of sense amplifiers SA0 to SAn. The PMOS transistor controlled by the control signal SLE2x is distributed for each of the sense amplifiers SA0 to SAn. Therefore, the stray capacitance of the bit line and the higher-voltage-side drive wire PSA to be driven by each PMOS transistor is reduced. Thus, the load can be distributed. Regions in which PMOS transistors are located can be distributed. Thus, each of the transistor regions in enough size can be obtained, which improves the drive ability of the PMOS transistors. As a result, the drive ability can be improved at the second voltage VIID, which is lower than the power source voltage VDD. Then, the first stage of the restore operation (FIG. 5, (1)) and the first stage of the equalize operation (FIG. 5, (3)) can be faster.

Figure 6:
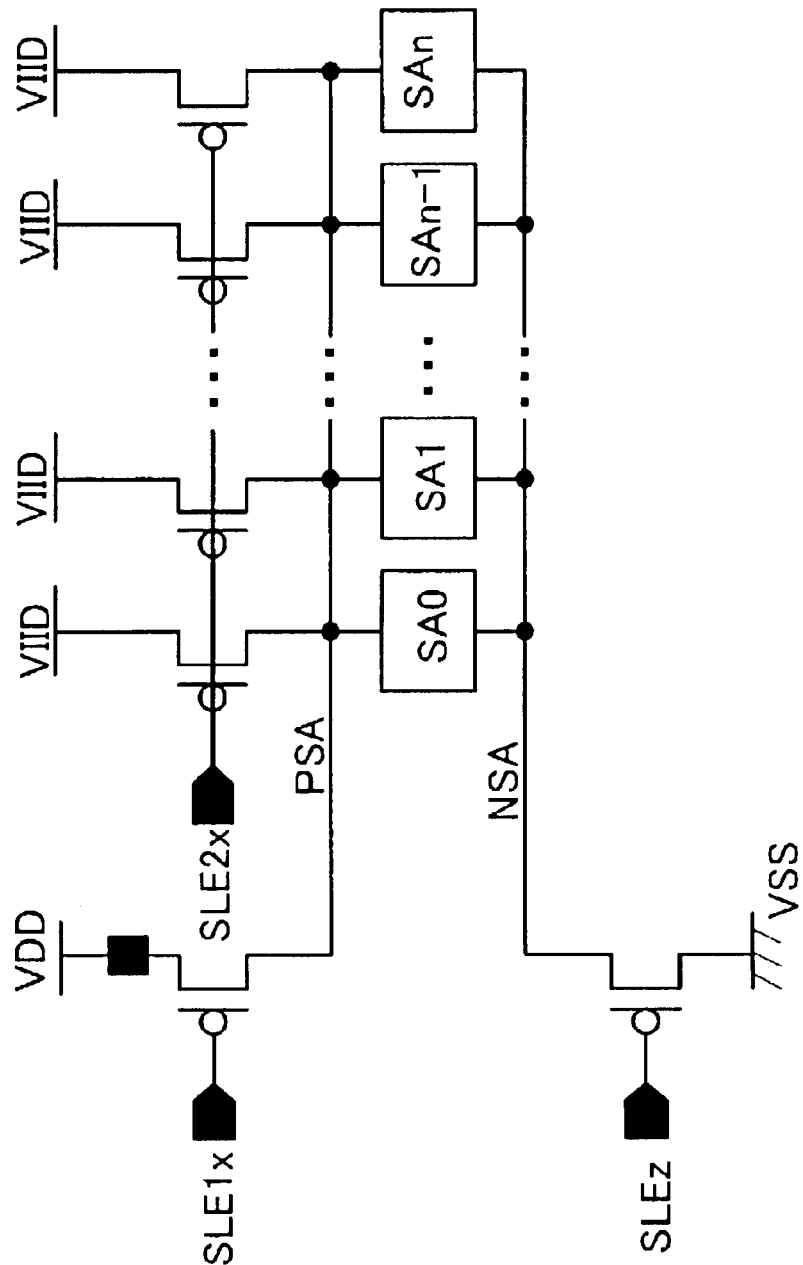
FIG. 6 is a circuit diagram showing a first specific example according to the first embodiment.

In the first specific example in FIG. 6 describes the construction where a PMOS transistor is distributed for each of the sense amplifiers SA0 to SAn. However, it is not limited thereto. One PMOS transistor may be provided for a predetermined number of sense amplifiers in accordance with the drive ability of the PMOS transistor. Conversely, multiple PMOS transistors may be provided to one sense amplifier.

Figure 7:
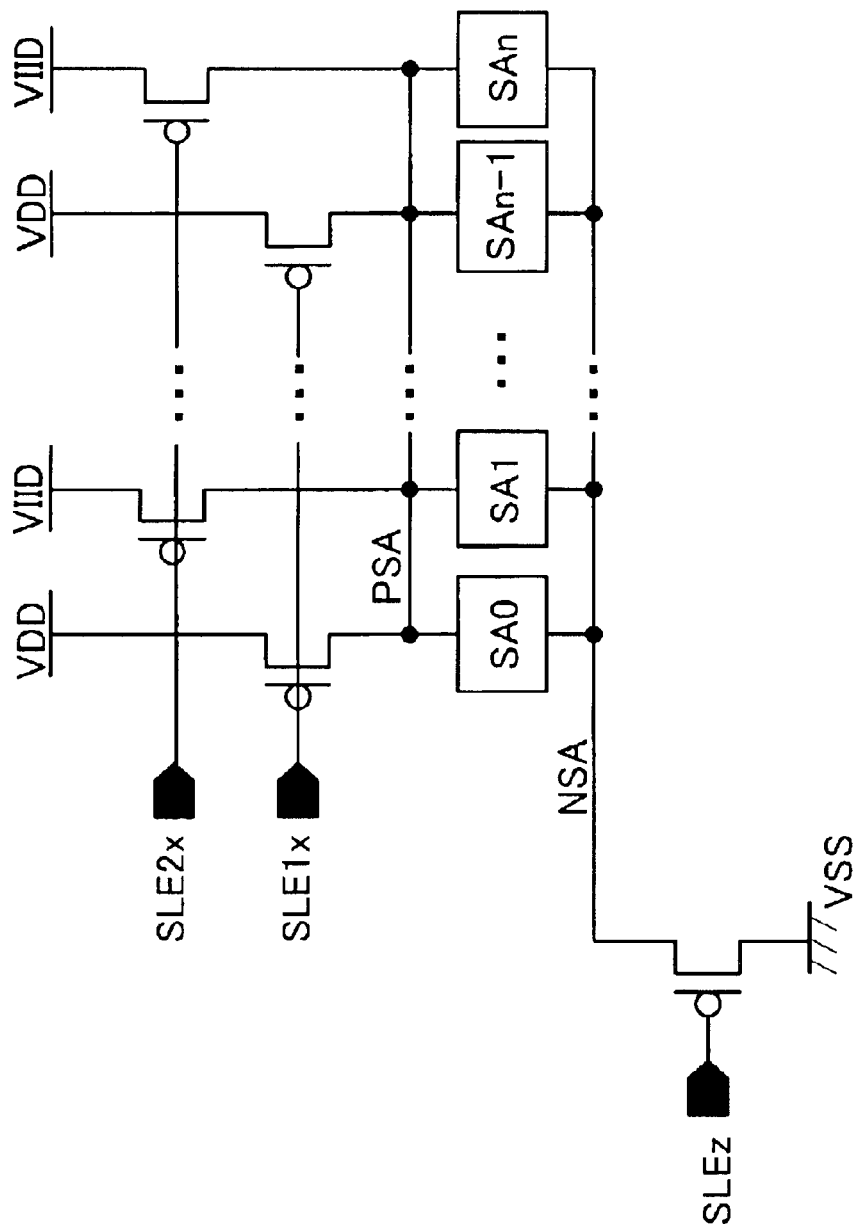
FIG. 7 is a circuit diagram showing a second specific example according to the first embodiment.

In the second specific example shown in FIG. 7, a pair of PMOS transistor for supplying the second voltage VIID and PMOS transistor for supplying the power source voltage VDD to the higher-voltage-side drive wire PSA is provided for each of pairs of the sense amplifiers SA0 and SA1 to SAn-1, SAn. A pair of PMOS transistors controlled by the SLE1x and SLE2x, respectively, is distributed. Therefore, the stray capacitance of the bit lines and the higher-voltage-side drive wire PSA, which are driven through respective PMOS transistors, is reduced. As a result, the load can be distributed. Since the regions in which PMOS transistors are located, respectively is distributed. Thus, transistor regions in enough size can be obtained. Also, the drive ability of the PMOS transistor can be improved. Thus, the supply ability of the power source voltage VDD, which is the first voltage, and the second voltage VIID can be improved together. Then, the operations in the first and the second stages (FIG. 5, (1) and (2)) of the restore operation and the first and the second stages of the equalize (FIG. 5, (3) and (4)) of the equalizing operation may be faster.

A pair of PMOS transistors may be located for each two pairs of sense amplifiers or for each predetermined number of sense amplifiers. Conversely, multiple pairs of PMOS transistors may be located to one sense amplifier. It is not always necessary to provide a pair of PMOS transistors. The located number and the locations may be changed in accordance with the drive ability, operation characteristics and so on of each PMOS transistor.

Figure 8:
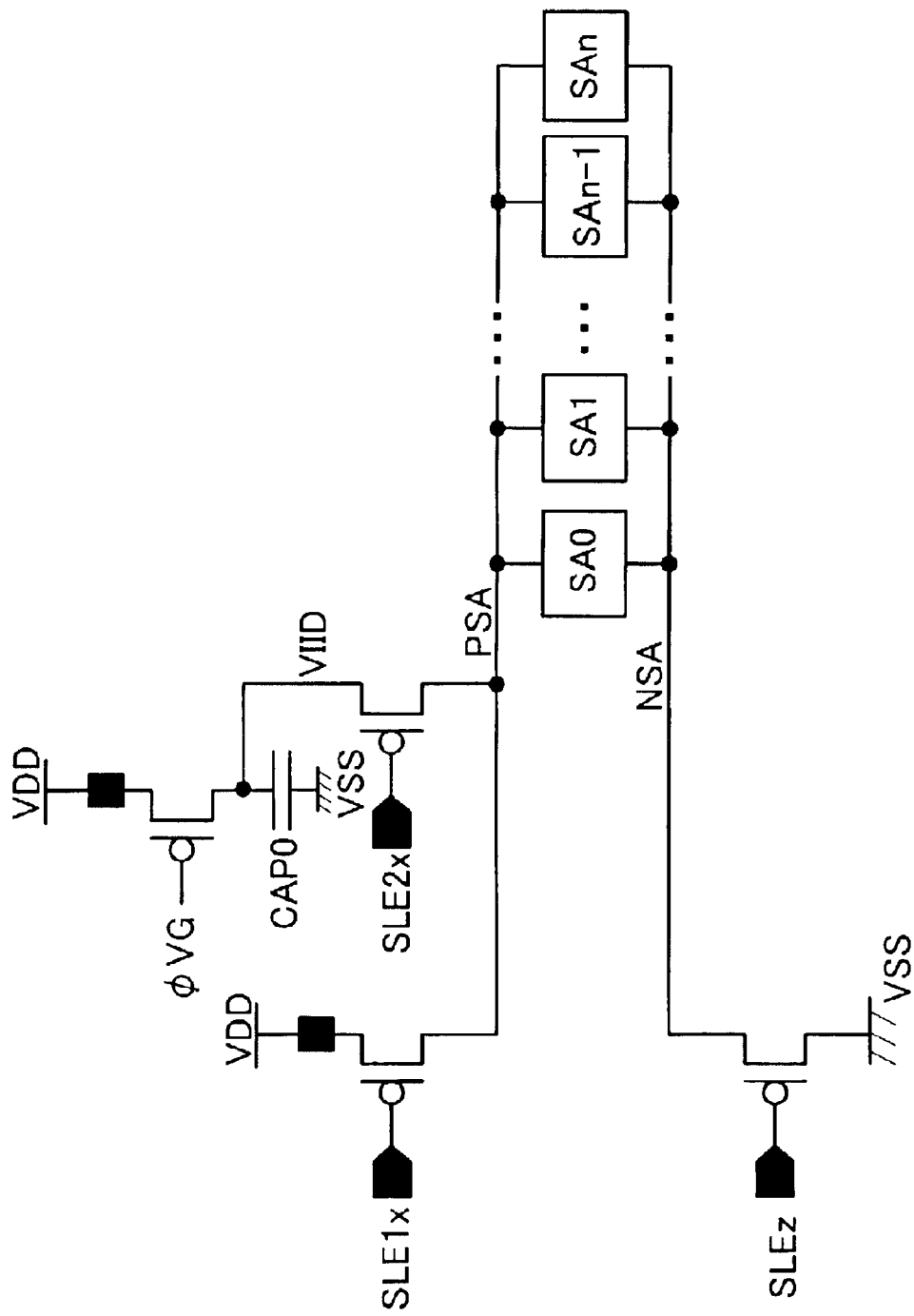
FIG. 8 is a circuit diagram showing a third specific example according to the first embodiment.

In the third specific example shown in FIG. 8, a leak compensation function for compensating leak charge is provided when charge stored in the recycling capacitor CAP0 leaks. A PMOS transistor whose gate voltage is controlled by a control signal ΦVG is connected between a charge storing terminal of the recycling capacitor CAP0 and the power source voltage VDD. In the refresh operation in a semiconductor memory device, a refresh cycle is determined in accordance with the device performance, a circuit specification and so on. The cycle generally takes a long time. Especially, when the equalizing voltage is set at the low voltage level in order to improve the tREF characteristic of the cell capacitor significantly, the refresh cycle takes a longer time. Therefore, the voltage value of the second voltage VIID may be reduced due to the charge leak from the recycling capacitor CAP0 during the cycle. In addition, the second voltage VIID may be changed due to the effects such as power source noises from the outside of the device.

In order to prevent the voltage change in the second voltage VIID, the PMOS transistor is biased by the control signal ΦVG during the period when the device is deactivated. Thus, charge is supplemented thereto from the power source voltage VDD. In the third specific example, the control signal ΦVG is an analog control signal. The gate terminal of the PMOS transistor is biased by the analog control voltage ΦVG so that the PMOS transistor is used as a voltage controlled current source and the leaked charge is supplemented. In this case, preferably, the terminal voltage of the recycling capacitor CAP0 is monitored, and the feedback circuit for controlling a voltage value of the analog control voltage ΦVG is provided. The PMOS transistor may be connected to the internal step-down power source circuit VIID by using the control signal ΦVG as a digital control signal.

Figure 9:
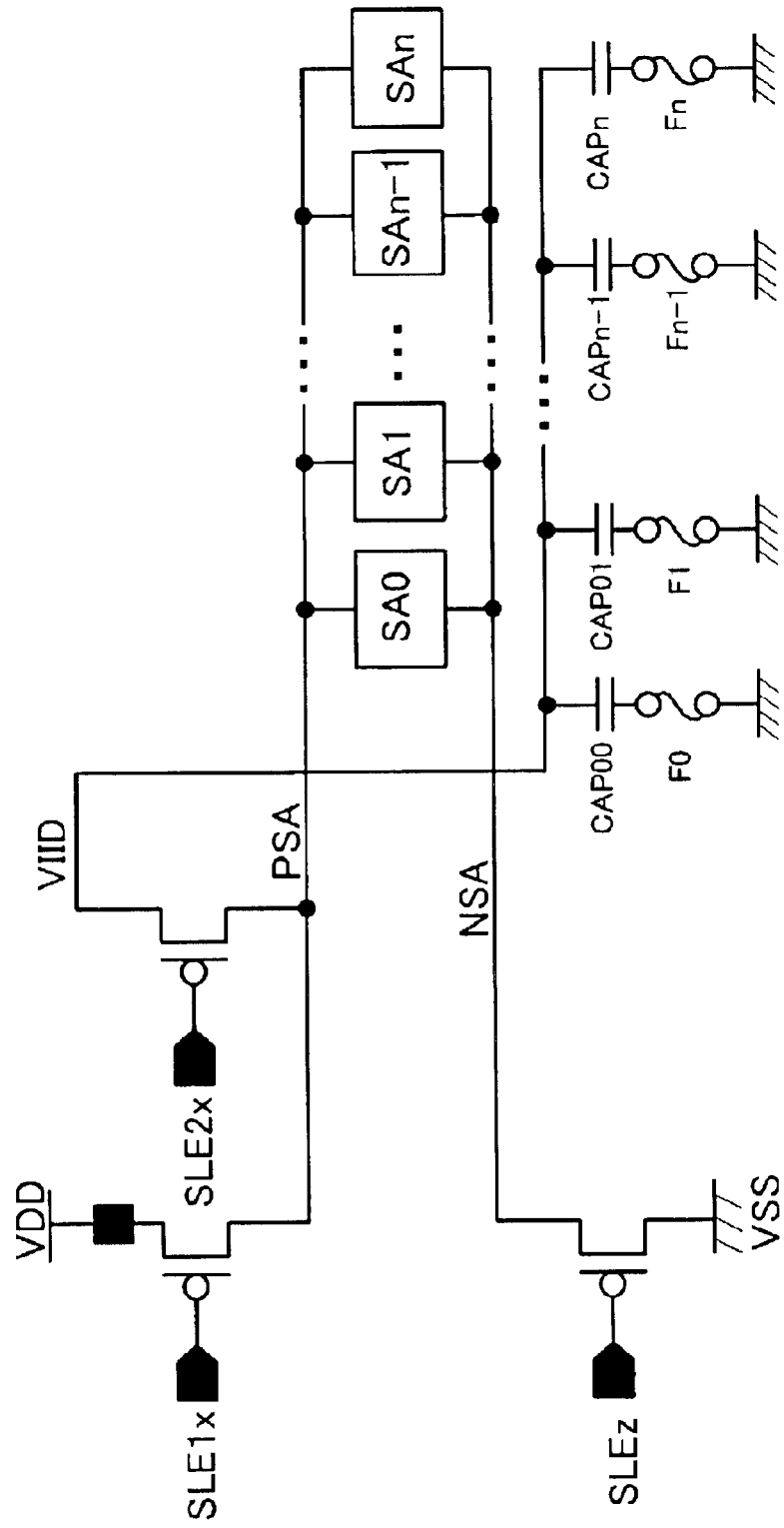
FIG. 9 is a circuit diagram showing a fourth specific example according to the first embodiment.

In the fourth specific example shown in FIG. 9, recycling capacitors are distributed, and each of the recycling capacitors CAP00 to CAP0n are connected to the reference voltage VSS through fuse elements F0 to Fn.

Each of the recycling capacitors CAP00 to CAP0n can use a dummy cell within the dummy cell array region DMC (see FIG. 3) located at the end of the memory cell array region MC. The dummy cell has a large capacitance value for each unit area because it has the same structure as that of the memory cell capacitor. Furthermore, the dummy cell can be used as it is, which is within the dummy cell array region DMC located in the border portion between the memory cell array region MC and the peripheral region in the device structure. It is not necessary to provide a new capacitor for the recycling capacitor. Therefore, the recycling capacitor can be constructed without any penalty regarding the chip area.

The memory cell array region MC and the peripheral region here have different device structures from each other, each stack height from the semiconductor substrate is different. The dummy cell located in the border region may have large variation in device characteristic. Since the step due to the difference in stack height exists, the percentage of defects may be higher. Even when the percentage of defects is not so high, the oxide film included in the dummy cell capacitor is equivalent to the oxide film including nitride film included in the cell capacitor. Thus, a certain percentage of defects may occur.

Since the recycling capacitor needs a capacitance value, which is larger enough than the total stray capacitance such as bit lines. Thus, even if a dummy cell in the oxide film having a higher dielectric constant is used, many dummy cell capacitors CAP00 to CAP0n must be connected in parallel. Therefore, under this stage, the recycling capacitor is shorted because one dummy cell has a defect. Thus, fuse elements F0 to Fn are provided in the dummy cell capacitors CAP00 to CAP0n, respectively in advance, and the defect cell caused at a certain probability is separated individually. As a result, the recycling capacitor can be constructed with high reliability.

Here, the fourth specific example describes the construction in which the fuse elements F0 to Fn are located in the reference voltage side VSS. However, these fuse elements may be located in the terminal in the opposite side. Instead of the fuse elements F0 to Fn, a switch elements or other switching circuits may be provided for the MOS transistor, the transfer gate, and so on.

This example describes the case where a dummy cell capacitor located in dummy cell array region DMC as a capacitor having the same structure as the memory cell capacitor structure is used. However, many capacitors having the equivalent structure may be located in the peripheral region of the sense amplifier group SA and the word line driver group WD as a unit. In this case, by using a memory cell type capacitor having the structure equivalent to the memory cell capacitor, a capacitor group having a large capacitance value for each unit area can be obtained. Thus, the recycling capacitor can be constructed efficiently in terms of area. Furthermore, the dummy cell capacitor or the memory cell type capacitor may be mixed therein.

According to the above-described first embodiment, when differentially amplifying each pair of bit lines BL0,/BL0 to BLn,/BLn, the higher-voltage-side drive wire PSA of the sense amplifier group is switched by two levels from the equalizing voltage VPR to the power source voltage VDD, which is the first voltage, through the second voltage VIID. Thus, for each of the bit lines in the higher voltage side among the pairs of bit lines BL0,/BL0 to BLn,/BLn, the reuse of charge from the equalizing voltage VPR to the second voltage VIID during the restoration in memory cells and the restore of charge from the power source voltage VDD to the second voltage VIID during the equalization are repeated alternately. Thus, the stored charge in the recycling capacitor CAP0 can be recycled. As a result, charging/discharging current to the bit lines BL0 to /BLn can be reduced.

The equalizing voltage VPR is set at lower voltage than ½ of the power source voltage VDD. Therefore, there becomes large voltage difference between the equalizing voltage VPR and the power source voltage VDD, which is the voltage level of data "1" stored in the memory cell capacitor. As a result, the data holding time tREF becomes longer, which allows the improvement in the data holding characteristic. The equalizing voltage VPR at this time can be obtained easily by equalizing the pairs of bit lines BL0,/BL0 to BLn,/BLn, which are maintained at the second voltage VIID and the reference voltage VSS. The number of times of the refresh operations within a predetermined period of time can be reduced, which can reduce current consumption involved in the refresh operations.

Because of the reduction of current charged/discharged to the bit lines BL0 to /BLn and the improvement in the data holding characteristic, both of which can be achived by the charge recycling, when the semiconductor memory device according to the first embodiment is used for a mobile apparatus and so on, the current consumption in stand-by mode can be reduced significantly. The successive usable time during the battery driving can be significantly improved.

According to the first and the second specific example of the first embodiment, the supply ability of the PMOS transistor connected to a path from the second voltage VIID included in the second voltage supply section can be enhanced more than the supply ability of the PMOS transistor connected to a path from the power source voltage VDD included in the first voltage supply section. Therefore, the deterioration of the drive ability of the second voltage VIID, which is lower than the power source voltage VDD, can be enhanced. As a result, the first stage (FIG. 5, (1)) of the restore operation and the first stage (FIG. 5, (3)) of the equalize operation where the high-voltage-side drive wire PSA of the sense amplifier group is at the second voltage VIID can be faster among the restore operations to a memory cell and the equalize operations of the pairs of the BL0,/BL0 to BLn,/BLn, which are performed through two stages. Thus, the restore operations and the equalize operations can be faster.

A PMOS transistor for supplying the second voltage VIID or respective PMOS transistors for supplying power source voltage VDD and the second voltage VIID are distributed in accordance with the arrangement of the sense amplifier group. Thus, the supply ability of the second voltage VIID or the power source voltage VDD and the second voltage VIID does not vary among the sense amplifiers SA0 to SAn. As a result, the drive ability of each of the sense amplifiers SA0 to SAn can be balanced, which allows the performance of the optimum operations.

According to the third specific example of the first embodiment, in stand-by mode where a waiting state between refresh operations is long, proper voltage value VIID can be maintained even when change in the second voltage VIID may occur due to the influence from leaks of the recycling capacitor and/or noises.

According to the fourth specific example of the first embodiment, a capacitor structure with a good efficiency in area, which has a structure equivalent to that of the memory cell capacitor, is used. Here, the capacitor structure can be connected to dummy cells CAP00 to CAP0n or the other capacitor unit, which can be connected and be separated individually. Therefore, a capacitor unit in which a defect exists can be individually separated. As a result, the recycling capacitor CAP0 can be arranged with higher reliability.

Figure 10:
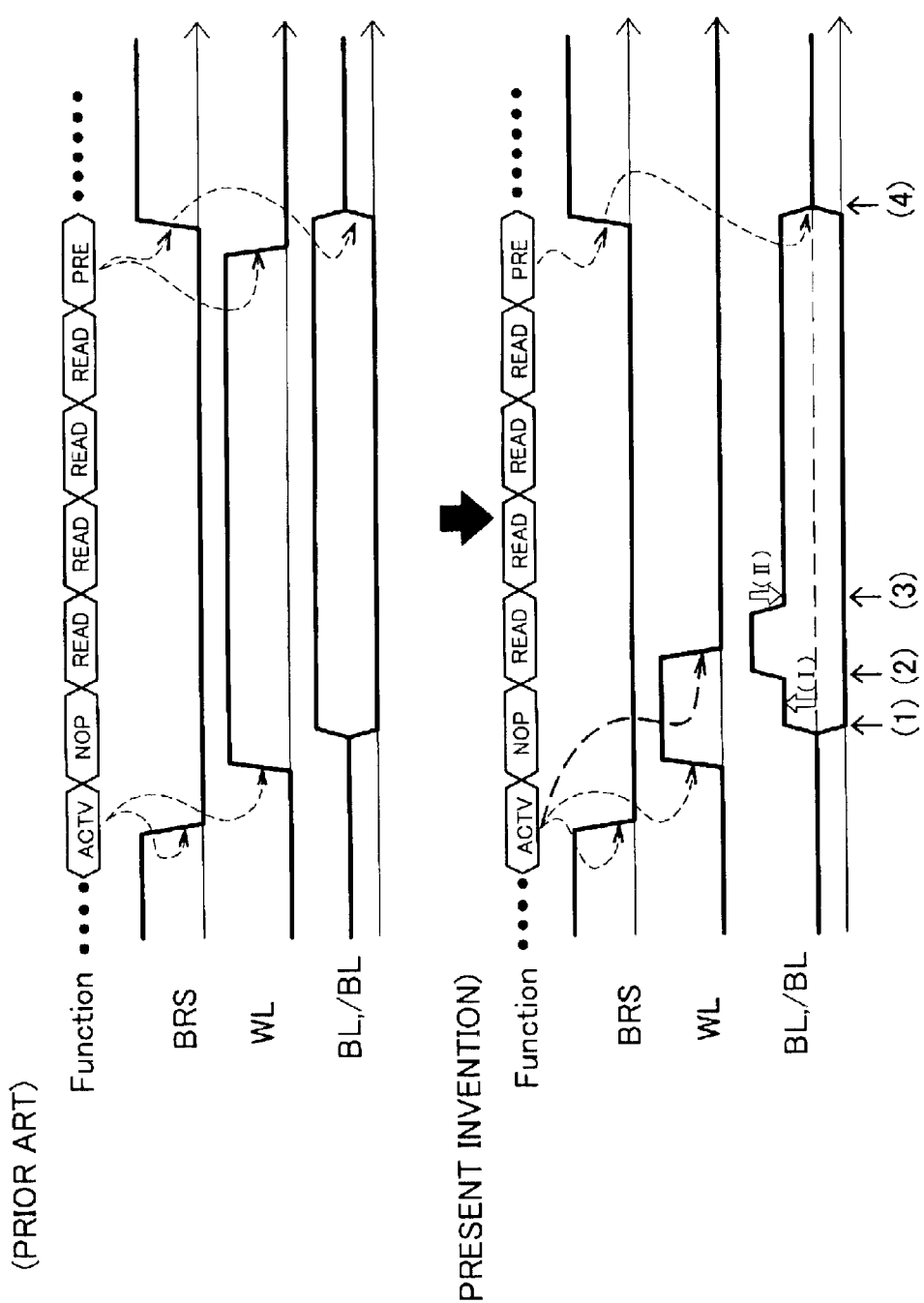
FIG. 10 is an operation waveform diagram showing an operation according to a second embodiment.
Figure 11:
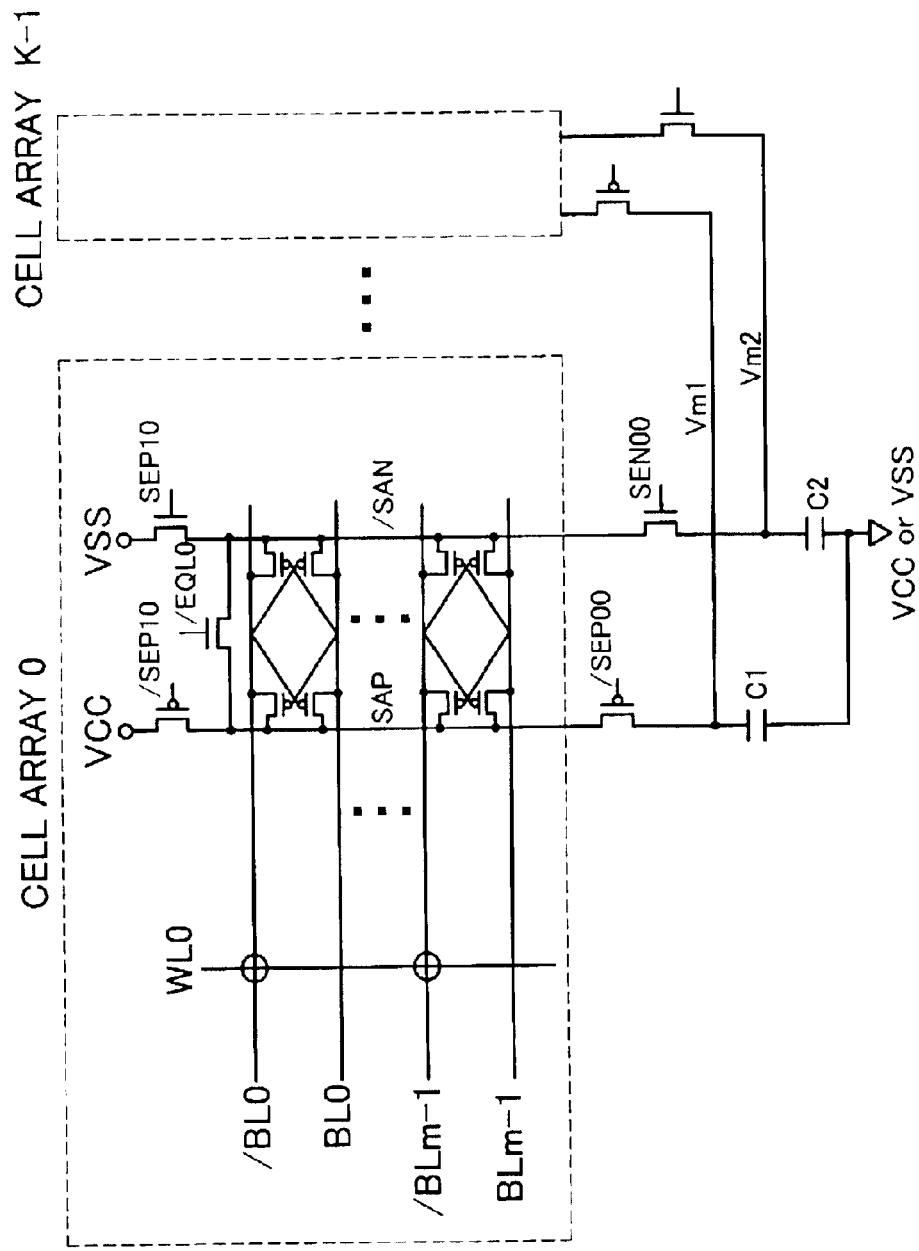
FIG. 11 is a circuit diagram of the related art.
Figure 12:
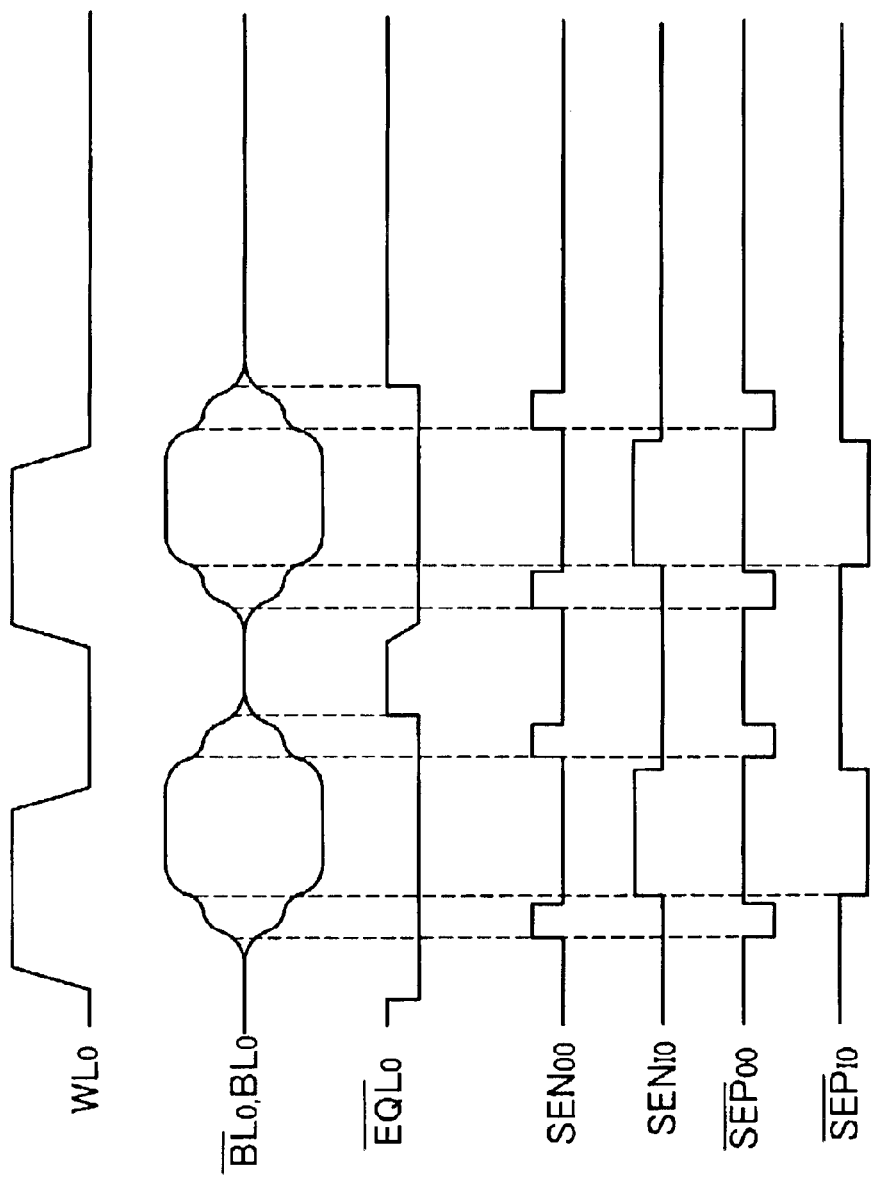
FIG. 12 is an operational waveform diagram showing an operation according to the technology of the related art.

Next, a second embodiment is shown in FIG. 10. FIG. 10 describes the second embodiment by using a burst read operation, which is in successive access mode, as an example. In FIG. 10, states of operations by a semiconductor memory device are shown in fields belonging to "Function". Each of these operations is controlled by a signal input to an external control terminal for an asynchronous DRAM, for example. For an SDRAM, each of these operations is controlled by a command input synchronously with a system clock signal. According to technologies of the related art, in active mode (ACTV), an equalizing signal BRS is deactivated and the word line WL is activated. Then, bit line pairs (BL,/BL) are differentially amplified by sense amplifiers, and the restore operation is performed on memory cells. Bit line pairs are sequentially selected by successive read operations (READ). Thus, data is output. After the predetermined bit number of data are output, a precharge operation (PRE) is performed, then, the word line WL is not activated, and the equalizing signal BRS is activated. Thus, the bit line pairs (BL,/BL) are equalized, and the burst operation ends.

When the burst operation is performed in the semiconductor memory device according to the present invention, the word line is activated, and the bit line pairs (BL,/BL) are supplied with charge from the recycling capacitor CAP0 (FIG. 10, (I)). When the restore operation is performed through two stages (FIG. 10, (1) and (2)), the successive read operation (READ) is initialized. The data read here is data read to the bit line pairs (BL,/BL).

While the word line WL is deactivated in parallel with the successive read operation, the bit line pairs (BL,/BL) are differentially amplified at that time. Therefore, data in the cell capacitors are read out to the bit lines BL or /BL. Therefore, the word line WL can be deactivated without any problem. Subsequently, the bit lines in the higher voltage side are turned to the second voltage VIID in order to restore charge (FIG. 10, (II)). Then, the first stage of the equalize operation is performed in advance (FIG. 10, (3)). The differential voltage of the bit line pairs (BL,/BL) are reduced from the power source voltage VDD to the second voltage VIID but has a voltage difference of the second voltage VIID. Therefore, the successive read operation is continued without any problem. After the read operation, the bit line pairs (BL,/BL) are equalized (FIG. 10, (4)) to ½ voltage of the second voltage VIID by the equalizing signal BRS.

The operation for the first stage in the equalize operation performed through two stages can be embedded within a period for successive readout and can be performed in advance thereby. Therefore, the equalize operation only in the second stage may be performed in the period for precharge operation (PRE). As a result, the equalize operation in the burst read operation can be faster, which can reduce the cycle time in the burst operation.

The second embodiment in FIG. 10 is described for the application to the burst read operation. However, the present invention can be applied to a general page operation in the same manner if it is a successive operation. The burst operation and the page operation differ in that a column address is changed sequentially or at random. The equalize operation in the first stage on the bit line pairs (BL,/BL) are the same in both operation modes.

Furthermore, the present invention can be applied to a successive write operation. In this case, a series of data to be successively written may be captured by data temporally holding means such as a buffer circuit within the device when or after the initiation of the active operation (ACTV), which is the initial stage of the successive operation mode. Thus, data is captured sequentially from the data temporally holding means in the successive write cycle, and data is written. If the word line WL is deactivated when the last bit has completely written and before the equalize operation, the first stage of the equalize operation can be embedded in the successive write operation like the successive read operation.

The precharge operation (PRE) may be started automatically in timing accordance with the end of the successive operation. Alternatively, data temporally holding means such as a buffer circuit for reading out data may be provided, and the word line is deactivated so that the bit line can be at the second voltage VIID and the precharge operation (PRE) may be performed after the charge restoration has been performed completely. Alternatively, the precharge operation (PRE) may be performed in response to a precharge command, for example, from the outside.

According to the second embodiment, the reduction of current charged/discharged to the bit lines because of the charge recycling for the bit lines in the higher-voltage side among each bit line pairs (BL,/BL) and the improvement in the data holding characteristic by setting the equalizing voltage to the voltage lower than ½ of the power source voltage VDD are applied to the successive access operation, the first stage of the two stages of equalizing operations can be embedded in the successive access operation. Thus, the cycle time characteristic can be improved. In the semiconductor memory device having successive access operations such as burst operations, the current consumption in stand-by mode can be reduced significantly. When the semiconductor memory device is used in a mobile apparatus, the successive usable time in battery-driven mode can be improved significantly.

Here, the successive access operation includes both of the successive read operation and the successive write operation. For the successive write operation, a predetermined number of bits can be captured and held in a written data holding function for temporally holding data, such as a buffer circuit.

The bit line pairs (BL,/BL) may be equalized after the successive operations have been completed, after the bit lines are at the second voltage VIID and the charge has been completely restored, or in response to an input of, for example, a precharge command from the outside.

The present invention is not limited to the embodiments, and various improvements and variations are possible without departing the spirit of the present invention. For example, this embodiment described a case where the recycling capacitor CAP0 is connected to the reference terminal VSS. However, the present invention is not limited thereto. The recycling capacitor CAP0 can be connected to any voltage, which can store charge, including the power source voltage VDD and the other fixed voltages. It has been described that the second voltage VIID is ⅔ voltage of the power source voltage VDD. However, the second voltage VIID can be set at a lower voltage. In this case, the tREF characteristic can be improved more. In this embodiment, the case is illustrated where the lower-side voltage is the reference voltage VSS and the power source voltage VDD, which is the first voltage VDD, and the second voltage VIID are set to the lower side voltage. However, the lower-side voltage can be set at a voltage different from the reference voltage VSS. For example, a negative voltage can be applied.

According to the present invention, current charged/discharged to bit lines can be reduced because of the charge recycling technology. Further, the data holding characteristic of cell capacitors can be improved at the same time such that the number of refresh operations within a certain period of time can be reduced. Thus, a semiconductor memory device, which allows the reduction of the current consumption in stand-by mode and the data access method for the semiconductor memory device can be provided.

What is claimed is:

1. A semiconductor memory device, comprising an activation unit arranged for each predetermined bit line pairs;
    a sense amplifier group for differentially amplifying each bit line pair within the activation unit by using, as a reference voltage, a lower-side voltage supplied to a lower-voltage-side drive wire;
    a voltage supplying section for supplying a first voltage, which is a restore voltage to memory cells, to a higher-voltage-side drive wire of the sense amplifier group; and
    equalizing sections for equalizing the bit line pairs to an intermediate voltage, which is lower than ½ of the first voltage,
    wherein the voltage supplying section includes at least one first voltage supply section for supplying the first voltage and at least one second voltage supplying section for supplying a second voltage, which is lower than the first voltage.

2. A semiconductor memory device according to claim 1, the equalizing sections having short circuiting sections for shorting the bit line pairs,
    wherein the short circuiting sections are activated when the voltage of bit lines included in the bit line pairs are the second voltage and the lower-side voltage.

3. A semiconductor memory device according to claim 1, the first and second voltage supply section having the first and second switching section, respectively, for connecting between the first and the second voltages and the higher-voltage side drive wire of the sense amplifier group, wherein, for restoring in the memory cells, after the second switching section is selected, the second switching section is non-selected and the first switching section is selected; and wherein, for equalizing the bit line pairs, after the first switching section is non-selected and the second switching section is selected, the second switching section is non-selected.

4. A semiconductor memory device according to claim 1, wherein the second voltage supply section has charge-recycling unit for recycling charge to be charged/discharged to the bit lines in the higher-voltage side of the bit line pairs to the second voltage.

5. A semiconductor memory device according to claim 1, wherein more number of the second voltage supply sections are provided than the number of the first voltage supply sections.

6. A semiconductor memory device according to claim 5, wherein a plurality of the second voltage supply sections are distributed in accordance with the arrangement of the sense amplifier group.

7. A semiconductor memory device according to claim 1, wherein a plurality of the first and the second voltage supply sections are distributed alternately in accordance with arrangement of the sense amplifier group.

8. A semiconductor memory device according to claim 4, wherein the charge-recycling unit includes a leak compensating section.

9. A semiconductor memory device according to claim 8, wherein the leak compensating section includes a leak-compensation switching section for controlling charge supply to the charge-recycling unit.

10. A semiconductor memory device according to claim 4, wherein the charge-recycling unit includes a memory cell-type capacitor including a structure equivalent to a memory cell capacitor.

11. A semiconductor memory device according to claim 10, wherein the memory-cell-type capacitor includes a dummy cell capacitor provided as a non-memory cell within the activation unit.

12. A semiconductor memory device according to claim 10, wherein the charge-recycling unit is arranged by connecting a plurality of the memory-cell-type capacitor are connected to each other; and wherein a connection-control switching section for controlling connection and separation is provided in each of the cell-type capacitor.

13. A semiconductor memory device according to claim 1, wherein the second voltage is an internal step-down voltage created by an internal step down power source circuit.

14. A data access method for a semiconductor memory device in which a lower-side voltage supplied to a lower-voltage-side drive wire of a sense amplifier group as a reference voltage, and, when each of bit line pairs is activation-controlled and is differentially amplified by the sense amplifier group, a first voltage, which is a restore voltage to a memory cell is supplied to a higher-voltage-side drive wire of the sense amplifier group, wherein, for equalization, after the higher-voltage-side drive wire is switched from the first voltage to a second voltage, which is lower than the first voltage, and charge discharged from the first voltage to the second voltage is stored, each of the bit line pairs is equalized to an intermediate voltage, which is lower than ½ of the first voltage; and wherein, for restoration, after the higher-voltage-side drive wire is switched to the second voltage and is differentially amplified, and the stored charge is reused for charging from the intermediate voltage to the second voltage, the higher-voltage-side drive wire is switched to the first voltage and is differentially amplified.

15. A data access method for a semiconductor memory device in which a lower-side voltage supplied to a lower-voltage-side drive wire of a sense amplifier group as a reference voltage, and, when each of bit line pairs is activation-controlled and is differentially amplified by the sense amplifier group, a first voltage, which is a restore voltage to a memory cell is supplied to a higher-voltage-side drive wire of the sense amplifier group, wherein data access is performed by one cycle including:

a word line activating process for activating a word line;

a charge reusing and activating process for supplying a second voltage lower than the first voltage to the higher-voltage-side drive wire and then activating the sense amplifier group;

a restoring and activating process for, after each of the bit line pairs is differentially amplified to the second voltage, supplying the first voltage instead of the second voltage to the higher-voltage-side drive wire and then activating the sense amplifier group;

a word line deactivating process for deactivating the word line after the memory cell is restored to the first voltage, a charge restoring process for supplying the second voltage instead of the first voltage to the higher-voltage-side drive wire;

a deactivating process for terminating voltage supply to the higher-voltage-side drive wire and then deactivating the sense amplifier group when voltages of bit lines included in each of the bit line pairs are the second voltage and the lower-side voltage; and an equalizing process for equalizing each of the bit line pairs to an intermediate voltage lower than ½ of the first voltage.

16. A data access method for a semiconductor memory device according to claim 15, wherein the equalizing process has a short process for shorting each of the bit pairs; and wherein the intermediate voltage is equal to ½ of the second voltage.

17. A data access method for a semiconductor memory device according to claim 15, wherein the charge restored in the charge restoring process is stored and held until it is reused in the charge reusing and activating process in the next cycle.

18. A data access method for a semiconductor memory device according to claim 17, further comprising a compensating process for compensating charge equal to charge lost while it is stored in the charge restoring process and is reused in the charge reusing and activating process in the next cycle.

19. A data access method for a semiconductor memory device, comprising the steps of:

for an activation unit in which each of bit line pairs is activated and is controlled, activating a word line in response to a command from the outside;

using, as a reference voltage, lower-side voltage supplied to a lower-voltage-side drive wire in a sense amplifier group to supply a first voltage, which is a restore voltage to a memory cell, to a higher-voltage-side drive wire and then to differentially amplify the bit line pairs;

accessing a predetermined bit number of data successively in response to subsequent, successive access commands;

driving the higher-voltage-side drive wire by a second voltage, which is lower than the first voltage;

reusing charge, which is used for charging the each of the bit lines from an equalizing voltage to the second voltage;

driving the higher-voltage-side drive wire by the first voltage;

after the memory cell is restored, deactivating the word line in parallel with the successive accesses to the predetermined bit number of data;

subsequently switching the higher-voltage-side drive wire from the first voltage to the second voltage;

restoring charge which is used for discharging each of the bit line pairs from the first voltage to the second voltage; and after restoring the charge, equalizing each of the bit line pairs to an intermediate voltage, which is lower than ½ of the first voltage.

20. A data access method for a semiconductor memory device, comprising the steps of:

for an activation unit in which each of bit line pairs is activated and is controlled, activating a word line in response to a command from the outside;

using, as a reference voltage, lower-side voltage supplied to a lower-voltage-side drive wire in a sense amplifier group to supply a first voltage, which is a restore voltage to a memory cell, to a higher-voltage-side drive wire and then to differentially amplify the bit line pairs;

accessing a predetermined bit number of data successively in response to subsequent, successive access commands; and restoring to the memory cell by having:

a charge reusing the activating process for supplying a second voltage, which is lower than the first voltage, to the higher-voltage-side drive wire and then activating the sense amplifier group; and after differentially amplifying each of bit line pairs by the second voltage, a restoring and activating process for supplying the first voltage instead of the second voltage to the higher-voltage-side drive wire, and wherein, after that, the method further comprising:

a successive-access process for accessing the predetermined bit number of data successively;

a word line deactivating process for deactivating the word line in parallel with the successive-access process;

a charge restoring process for supplying the second voltage instead of the first voltage to the higher-voltage-side drive wire, the charge restoring process following the word line deactivating process;

a deactivating process for, at the same time or after the charge restoring process, terminating voltage supply to the higher-voltage-side drive wire and for deactivating the sense amplifier group; and an equalizing process for equalizing each of the bit line pairs to an intermediate voltage, which is lower than ½ of the first voltage.

21. A data access method for a semiconductor memory device according to claim 20, wherein the word line deactivating process is performed individually from and in parallel with the successive-access process after the restoration to the memory cell when the successive access operations are successive read operation; and wherein the word line deactivating process is performed in parallel with final data writing in the successive access process when the successive access operations are successive write operations.

22. A data access method for a semiconductor memory device according to claim 20, further comprising a write-data holding process for temporally holding the predetermined bit number of write data, which is captured into the inside before the successive write operations when the successive accesses are successive write operations.

23. A data access method for a semiconductor memory device according to claim 20, wherein timing after the charge restoring process is timing when successive accesses to the predetermined bit number of data are completed.

24. A data access method for a semiconductor memory device according to claim 20, further comprising a read-data holding process for temporally holding the predetermined bit number of data, which is differentially amplified to each of the bit line pairs when the successive accesses are successive read operations, wherein timing after the charge restoring process is timing when the higher-voltage-side drive wire is switched from the first voltage to the second voltage.

25. A data access method for a semiconductor memory device according to claim 24, wherein the higher-voltage-side drive wire of the sense amplifier group is driven by the first voltage or the second voltage when the data is held in the read-data holding process.

26. A data access method for a semiconductor memory device according to claim 20, wherein timing after the charge restoring process depends on a command from the outside after successive accesses to the predetermined bit number of data are completed.

* * * * *